United States Patent [19]

Lim et al.

[11] Patent Number: 5,314,667
[45] Date of Patent: May 24, 1994

[54] METHOD AND APPARATUS FOR SINGLE CRYSTAL SILICON PRODUCTION

[76] Inventors: John C. Lim, 2589 N. Mountain Ave., Claremont, Calif. 91711; William A. Koch, 1781 Alicante, Pomona, Calif. 91768

[21] Appl. No.: 854,726

[22] Filed: Mar. 23, 1992

Related U.S. Application Data

[63] Continuation-in-part of Ser. No. 663,605, Mar. 4, 1991, abandoned.

[51] Int. Cl.⁵ ............................................. B07D 9/00
[52] U.S. Cl. ................................... 117/213; 117/214; 117/216; 117/31; 117/932
[58] Field of Search ............... 156/617.1, 618.1, 620.4, 156/DIG. 64; 422/249, 253

[56] References Cited

U.S. PATENT DOCUMENTS

| | | | |
|---|---|---|---|
| 4,659,421 | 4/1987 | Jewett | 156/617.1 |
| 4,659,423 | 4/1987 | Kim et al. | 422/249 |
| 4,894,206 | 1/1990 | Yamashita et al. | 422/249 |
| 5,009,863 | 4/1991 | Shima et al. | 156/DIG. 115 |
| 5,126,114 | 6/1992 | Kamio et al. | 422/249 |

FOREIGN PATENT DOCUMENTS 2180469A 4/1987 United Kingdom .

*Primary Examiner*—Olik Chaudhuri
*Assistant Examiner*—Felisa Garrett
*Attorney, Agent, or Firm*—Plante, Strauss & Vanderburgh

[57] ABSTRACT

There is disclosed a method for growing single crystal material, particularly silicon, in modified Czochralski process furnaces and chambers. The Czochralski process equipment is modified to permit continuous addition of polycrystalline material, preferably in dry powdered form to a molten bath of the material that is maintained at a constant shallow depth. For this purpose, a circular baffle is placed within the crucible containing the molten bath of the material, dividing the crucible into an annular feed zone and a central crystal growth zone. A cylindrical boule is withdrawn from the central crystal growth zone. The surrounding walls of the crucible, and graphite cup that supports the crucible, provide a heating and annealing zone in which the boule is continuously annealed as it is withdrawn from the molten pool. Dopants are also introduced into the annular feed zone, either separately or admixed with the polycrystalline material.

8 Claims, 2 Drawing Sheets

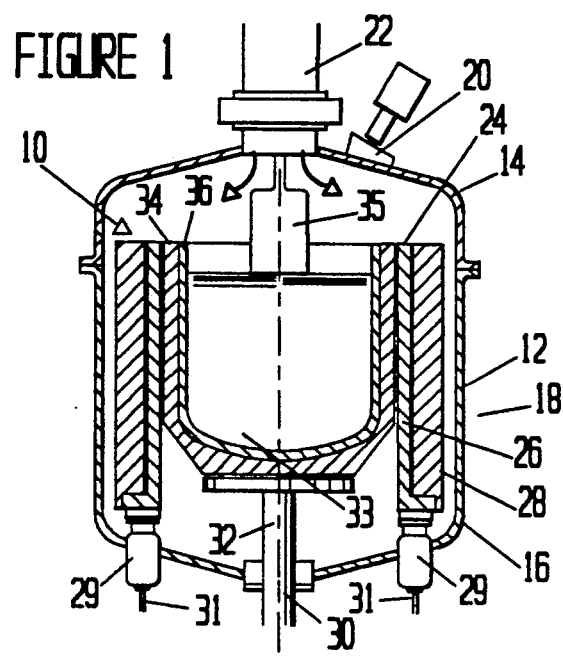
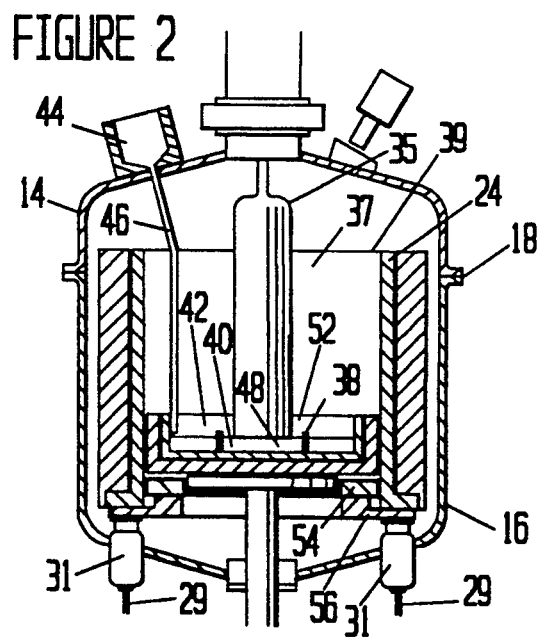

METHOD AND APPARATUS FOR SINGLE CRYSTAL SILICON PRODUCTION

This application is a continuation in part of our co-pending application, Ser. No. 663,605 filed Mar. 4, 1991 now abandoned.

BACKGROUND OF THE INVENTION

1. Field of Invention

This invention relates to a method for the production of single crystal material and, in particular, to an improved continuous method for the production of single crystal silicon.

2. Brief Statement of the Prior Art

Single crystal silicon is the basic substrate used for virtually all semiconductor devices. Other single crystal materials which are also finding applications in semiconductor devices are germanium and gallium arsenide. These materials are synthetically produced in a purified and perfect, single crystal state. The method traditionally used for such production has been the Czochralski method. In the Czochralski method, polycrystalline material, such as silicon, is melted and maintained in a molten state in a quartz crucible. The quartz crucible is supported by a graphite cup that is mounted in a heated furnace. A seed crystal of silicon is dipped in the molten silicon and is slowly withdrawn, forming a cylindrical boule of single crystal silicon. The boule and crucible are rotated counter-rotationally to promote uniformity of silicon properties and distribution of impurities and dopant additives within the silicon.

The Czochralski process is conducted batchwise and inherent limitations of batchwise processing cause, or promote, variations in properties and composition of the silicon boule. Dopants such as phosphorus or boron are usually added to the silicon melt to impart desirable semiconductor properties to the silicon wafers which are sliced from the cylindrical silicon boule. The dopants tend to concentrate in the molten pool as the pool is depleshished by the forming of the boule. Additionally, oxygen is introduced into the molten pool from reaction of the silicon melt with the surfaces of the quartz crucible. As the level of the molten pool decreases during the batch processing the wetted surface area decreases, resulting in a continuous decrease in oxygen concentration in the melt.

These and related inherent limitations in the Czochralski process have led to the improved process which is described in U.S. Pat. No. 4,659,421. In the improved process, the molten pool is maintained in a stationary crucible; a replenishment zone is established in the stationary crucible, laterally separated from a crystal growth zone, where the boule is formed. The molten silicon is mechanically pumped from the replenishment zone to the growth zone by rotating a feed rod of polycrystalline silicon, thereby stirring the molten liquid and inducing it to flow towards the crystal growth zone. The major advance of the improved Czochralski process was maintaining of the molten silicon in a shallow pool, thereby reducing the variation of dopant and oxygen contents in the cylindrical boule withdrawn from the pool.

The aforementioned improved process has some limitations. One limitation is that the improved process requires a completely redesigned furnace which utilizes none of the components of the traditional Czochralski process furnaces. The improved process requires that the feed material be supplied as a solid rod to stir the molten silicon pool, which is maintained in a stationary crucible. This requirement precludes the use of granular polycrystalline feed material. While the improved process produces silicon ingots of improved uniformity, a substantial investment in new process equipment is required for its practice. Also, the improved process does not anneal or thermal condition the single crystal boule.

OBJECTS OF THE INVENTION

It is an object of this invention to provide an improved process for the production of single crystal material.

It is a further object of this invention to provide a process for the production of cylindrical ingots of single crystal silicon of substantially improved uniformity and purity.

It is also an object of this invention to provide an improved process for the growth of single crystal material that can be practiced in equipment obtained by minor modification of existing Czochralski process furnaces.

It is an additional object of this invention to provide modifications of existing Czochralski process furnaces to permit practicing an improved process for the growth of single crystal material.

Other and related objects will be apparent from the following description of the invention.

BRIEF STATEMENT OF THE INVENTION

This invention comprises a method for growing single crystal material and equipment for use in the method. The invention can be used for the production of single crystal product from a variety of materials, including silicon, germanium, gallium arsenide, etc. It is particularly applicable to the production of single crystal silicon. The method is practiced in modified Czochralski process furnaces, which have been modified to permit continuous addition of polycrystalline material, preferably in granular form to a molten bath of the material that is maintained at a shallow depth. For this purpose, a circular baffle is placed within the crucible containing the molten bath of the material, dividing the crucible into an annular feed zone and an inner crystal growth zone. The boule is withdrawn from the central crystal growth zone and the surrounding walls of the crucible, and graphite cup that supports the crucible, provide a heating and annealing zone in which the boule is continuously annealed as it is withdrawn from the molten pool. Dopants are also introduced into the annular feed zone, either separately or admixed with the polycrystalline material.

BRIEF DESCRIPTION OF THE DRAWINGS

The invention will be described with reference to the Figures of which:

FIG. 1 is a sectional elevational view of a Czochralski process furnace;

FIG. 2 is a sectional elevational view of a modified Czochralski process furnace for use in the process of the invention;

DESCRIPTION OF PREFERRED EMBODIMENT

Figure 3:
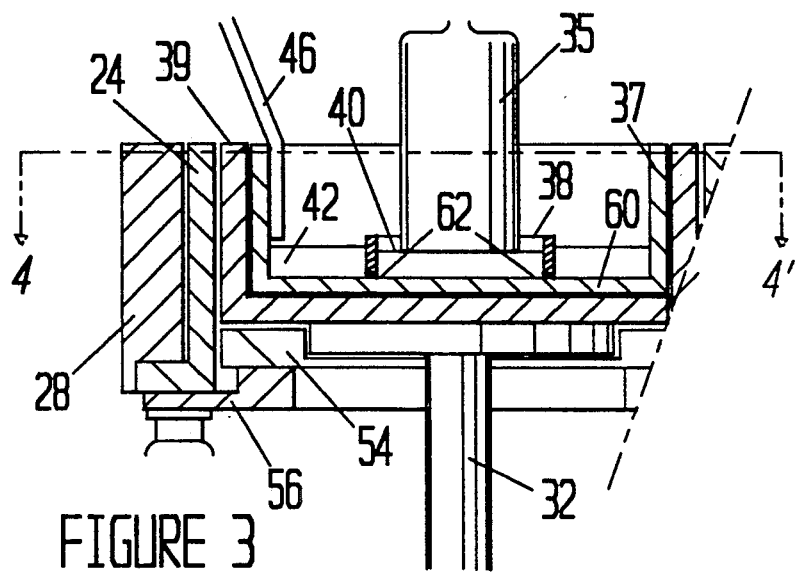
FIG. 3 is a sectional elevational view of the modified crucible, crucible holder and heater used in the process.

The invention is applied to a modified Czochralski process furnace such as that illustrated in FIG. 1. The furnace 10 is contained a surrounding vacuum chamber 12 formed from an upper half shell 14 and a lower half shell 16 which are joined together by annular flanges 18. The upper half shell 14 has a viewing port 20 and a centrally located, axially extending crystal receiving chamber 22. The vacuum chamber 12 contains a centrally located, furnace 10 which includes a circular heater 24 formed of vertical graphite elements 26 which are supplied with electrical power from electrical leads 31 which pass into the chamber through connectors 29. The heater 24 is surrounded by a protective cylindrical heat shield 28.

A centrally located shaft 30 extends axially into the lower shell 16, and this shaft is mounted for rotational and axial movement. The upper end 32 of the shaft 30 supports a graphite cup 34 in which is placed a quartz crucible 36. The crucible 36 has a generally conical bottom and has tall, vertical sidewalls a sufficient quantity of molten silicon which is used, in batchwise processing, to form the silicon boule.

A substantial quantity of feed material such as polycrystalline silicon is placed in the crucible and is heated to its melt temperature, in excess of 1400° C., and is maintained as a molten pool 33 by the furnace 10. A single seed crystal of silicon is dipped into the molten pool 33 and is slowly withdrawn, while being rotated in a counter-rotational direction to the rotation of the graphite cup and crucible. As the crystal is withdrawn, the molten silicon at the crystal solid/liquid interface crystallizes, forming a cylindrical boule 35.

As the molten pool 33 is diminished by the formation of the single crystal silicon boule, the crucible is elevated in the furnace. The vacuum chamber is continuously swept with a flow of argon which is introduced through the crystal receiving chamber 22 and which flows along the upper shell 14, downwardly about the cylindrical silicon boule 35 and across the molten pool 33 of the silicon. This flow of argon sweeps silicon oxide, which is formed by reaction of the silicon melt with the quartz crucible, from the vacuum chamber 12.

Figure 4:
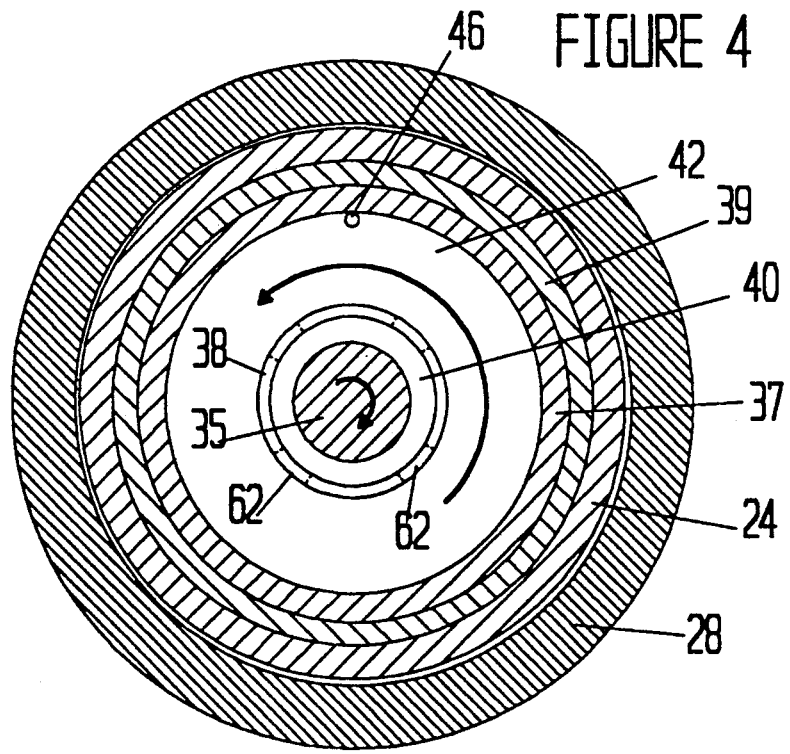
FIG. 4 is a sectional plan view along line 4—4' of FIG. 3.

The aforementioned Czochralski process furnace and vacuum chamber shown in FIG. 1 is modified for application of the continuous, shallow-pool method of this invention. The modified equipment is shown in FIGS. 2-4. Elements shown in these figures which are not modified from those previously described have the same numbers as in FIG. 1, and are not discussed further. In the modification, the crucible is modified to one having a flat bottom, and short side walls, thereby permitting one to minimize the quantity of the molten pool of silicon.

A circular baffle or weir 38 is centrally positioned in the crucible 37, closely surrounding the cylindrical boule 35 dividing the shallow molten pool 48 into a crystal growth zone 40 and an entirely surrounding annular feed zone 42. The crucible 37 is received within a graphite cup 39 which is surrounded by heater 24 and by a bottom heater 54. Electrical power is supplied to heater 54 by plate 56.

The polycrystalline material such as silicon, which can be in granular form, typically with an average particle diameter from 1 to about 1.5 millimeters, is continuously introduced into the annular zone, thus establishing this zone as an annular feed zone. For this purpose, a solids hopper 44 can be located on the upper half shell 14, and a feed conduit 46 is passed through the upper half shell 14 and terminates immediately above the surface of the molten shallow pool 48. The feed conduit 46 is positioned adjacent the inside vertical wall of the crucible 37, to introduce the feed material at a location closely adjacent the inside vertical wall of the crucible. One or more of the aforementioned solids hopper 44 and feed conduit 46 can be used. The polycrystalline material is supplied to the hopper in granular form and dopant material such as phosphoric acid, boron oxide, boric acid, etc., can also be introduced in the proportions required or desired in the single crystal silicon produced by the process.

The molten pool 48 within the crucible is maintained at a very shallow depth, from about 0.1 inch to no greater than about 2.0 inches, preferably from about 0.25 to about 1.0 inch, by limiting the amount of polycrystalline silicon initially introduced and thereafter by equalizing the rate of deplenishment of silicon, as controlled by the rate of withdrawal of the cylindrical boule 35, with the rate of introduction of the feed material to the crucible 37. In a typical application, the boule 35 is withdrawn at a rate from about 75 to about 100 millimeters per hour.

The cylindrical boule 35 of single crystal silicon is withdrawn from the crucible 37 and passes through a heated zone 52 entirely surrounded by the cylindrical heater 24. This heated zone 52 serves as an annealing zone in which the crystal is annealed and conditioned to obtain maximum crystal properties, such as strength.

Referring now to FIG. 3, there is illustrated an enlarged sectional view of the crucible 37 and heaters of the invention. As there illustrated, the graphite cup 39 is entirely surrounded by the cylindrical heater 24, and by a circular bottom wall heater 54. The heaters are also surrounded by insulators 56 and a heat shield 28.

The cylindrical weir 38 that divides the molten pool into a growth zone 40 and an annular feed zone 42 is supported on the bottom wall of the crucible 37, preferably supported a slight distance, e.g., from about 0.1 to about 0.2 inches above the bottom wall 60 of the crucible 37, thereby providing an annular flow zone 62 to permit molten silicon to flow from the annular feed zone 42 into the central crystal growth zone 40. The diameter of the cylindrical weir is about 20 to 50 percent and the height of the inner cylindrical weir 38 should be sufficient for the weir 38 to extend above the liquid level in the pool and, for this purpose, can be about 2.5 to 3.5 inches, preferably 2.5 inches. As illustrated, the height of the ring 38 to its diameter is 0.1875, and the right height is thus 18.75% to 31.5% of its diameter. The cylindrical weir 38 and the crucible 37 are formed of suitably thermally resistant materials and, for this purpose, quartz is the material of choice.

Referring now to FIG. 4, the locations of the various zones of the crucible will be apparent. The heat shield 28 surrounds the cylindrical heater 24 which surrounds the graphite cup 39. The crucible 37 is received within the graphite cup 24. The cylindrical boule 35 is formed in the central crystal growth zone 40 that is surrounded by the cylindrical weir 38. The polycrystalline feed material is introduced by conduit 46 into the annular zone 42 which entirely surrounds the weir 38. As the crucible 37 is continuously rotated beneath the feed material supply conduit 46, the feed material is distributed across the entire surface of the annular pool in zone 42, minimizing concentration gradients in the pool. The annular width of the feed zone 42 is sufficient to ensure the melting of the polycrystalline feed material, and the thorough mixing of the freshly introduced feed material with the body of the molten silicon before the molten material passes into the crystal growth zone 40.

The invention will now be described with reference to the following example which will serve to illustrate the process and demonstrate the results obtainable thereby.

EXAMPLE

In this example, a Czochralski process furnace having a crucible diameter of 16 inches was modified by the addition of a cylindrical ring having a diameter of 8 inches and a height of 2.5 inches to the bottom wall of the crucible, or 31.5% of its diameter. The lower edge of the ring was supported above the bottom wall of the crucible a distance of about 0.15 inch. The upper half shell of the vacuum chamber was modified to add a port to receive a supply conduit having a diameter of 0.5 inches, which was directed to discharge solids at the peripheral inside wall of the crucible, terminating approximately 3 inches above the bottom wall of the crucible. A solids hopper was mounted on the upper half shell and connected to the supply conduit.

The crucible was initially charged with 3000 grams of granular polycrystalline silicon and heated to a temperature of 1415° C., melting the polycrystalline material. A seed crystal of silicon was dipped into the liquid level within the crystal growth zone and the crucible was rotated at approximately 30 revolutions per minute, while the seed crystal was rotated counter-rotationally at approximately the same speed. The molten silicon formed a cylindrical boule having a nominal diameter of 100 mm. about the seed crystal, and the boule was withdrawn axially at a rate of 1.7 millimeters per minute. Granular polycrystalline silicon and phosphoric acid dopant were supplied at a rate sufficient to maintain the level of the molten pool at a depth of approximately 2.0 inches.

The process was practiced to obtain a single silicon ingot that was 55 cm in length with a diameter of 100 mm., weighing 10 kg. Thin circular wafers were cut from opposite ends of the ingot and were compared for properties. The following results were obtained.

TABLE

| Wafer Location | Boule Properties and Composition | | | |
|---|---|---|---|---|
| | Resistivity | Axial | Radial | Carbon (ppm) |
| Seed End | 4.3Ω/cm | 3 | 14.8 | <1.0 |
| Tang End | 3.5Ω/cm | 2 | 15.2 | <1.0 |

The foregoing results presented in the table demonstrate the high uniformity of the single crystalline silicon. The crystalline silicon ingot has very low variation in properties between its opposite ends thereby indicating that the shallow pool method greatly improved the overall properties of the ingot.

The invention was thus practiced and adopted to utilization of an existing Czochralski furnace and vacuum chamber without major modifications or changes. This resulted in substantial savings in equipment and time, as the existing Czochralski equipment was readily adapted to practice the method.

The invention has been described with reference to the illustrated and presently preferred embodiment. It is not intended that the invention be unduly limited by this disclosure of the presently preferred embodiment. Instead, it is intended that the invention be defined, by the means, and their obvious equivalents, set forth in the following claims.

What is claimed is:

1. An apparatus suitable for single crystal boule manufacture from a shallow, molten pool of silicon material which comprises:
   a. an enclosed housing having a first through opening supporting a rotatably mounted shaft;
   b. a support platform carried on the received end of said shaft, centrally located within said housing and carried thereon, a substantially flat-bottomed, quartz crucible resting within a graphite cup, said crucible and cup having circular bottom walls and cylindrical side walls;
   c. a furnace entirely surrounding said crucible and cup, and formed of a cylindrical heater closely surrounding said cylindrical side walls, and an annular bottom plate heater located beneath the said circular bottom walls;
   d. a quartz ring weir concentrically received within said crucible and having a diameter from about 20 to 50 percent the diameter of said crucible and a height from about 2.25 to 3.5 inches and from 18.75 to 31.5 percent of the diameter of the ring, and supported on said bottom wall of said crucible to divide said crucible into an outer annular zone and a central zone and located a slight distance above said bottom wall to permit molten silicon to flow from said annular zone to said central zone;
   e. a shallow, molten pool of silicon within said crucible and having a depth no greater than 2 inches with the upper level thereof located below the upper edge of said ring;
   f. a centrally located boule withdrawal compartment extending coaxially with said shaft and including means to dip a seed crystal of material into said molten pool contained within said central zone of said crucible and to slowly withdraw said boule therefrom;
   g. means to slowly rotate said shaft and support plate and said crucible and cup supported thereon;
   h. means to slowly rotate said boule counterrotationally to the rotation of said shaft; and
   i. a solids material supply conduit extending form a solids supply zone external of said housing and extending into said housing along the internal side wall of said crucible with its lowermost end terminating within said outer annular zone, for conveying granular polycrystalline material from said supply zone to said annular zone.

2. The apparatus of claim 1 wherein said material supply conduit terminates with its lowermost end above the upper level of said molten pool.

3. The apparatus of claim 2 including means to introduce an inert gas into said boule withdrawal chamber and means to withdraw said inert gas from said housing.

4. The apparatus of claim 2 including a granular solids hopper supported externally of said housing and in communication with said supply conduit as the source of granular material thereto.

5. In a Czochralski process furnace and vacuum chamber wherein a housing is provided with evacuation means to maintain its interior as a vacuum chamber and said housing has a centrally located cylindrical furnace which surrounds a crucible nested within a graphite cup which are mounted on a platform supported on a central shaft for rotational movement, and wherein said housing also has a communicating boule withdrawal chamber extending vertically axially therefrom, the improvement which comprises:

a. a substantially flat-bottomed crucible having a cylindrical side wall and mounted on said platform and an annular bottom plate heater located beneath said flat-bottomed crucible; and b. a quartz ring weir concentrically received within said crucible and having a diameter from about 20 to 50 percent the diameter of said crucible and a height from about 2.25 to 3.5 inches and from about 18.75 to 31.5 percent of the diameter of said ring and supported therein above said bottom wall of said crucible a slight distance to divide said crucible into an outer annular zone and a central zone;

c. a solids material supply conduit extending form a solids supply zone external of said housing and extending into said housing along the internal side wall of said crucible with its lowermost end terminating within said outer annular zones, for conveying granular polycrystalline material from said supply zone to said annular zone; and d. a shallow molten pool of silicon within said crucible having a depth no greater than 2 inches, and with its upper level beneath the upper edge of said ring.

6. The improved apparatus of claim 5 wherein said material supply conduit terminates with its lower end above the upper level of said molten pool.

7. The improved apparatus of claim 6 including means to introduce an inert gas into said boule withdrawal chamber and means to withdraw said inert gas from said housing.

8. The improved apparatus of claim 6 including a granular solids hopper supported externally of said housing and in communication with said supply conduit as the source of granular material thereto.

* * * * *